(12) United States Patent
Itoh (10) Patent No.: US 6,836,491 B2
(45) Date of Patent: Dec. 28, 2004

(54) SEMICONDUCTOR LASER DEVICE

(75) Inventor: Takashi Itoh, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 46 days.

(21) Appl. No.: 10/273,349

(22) Filed: Oct. 18, 2002

(65) Prior Publication Data

US 2003/0076862 A1 Apr. 24, 2003

(30) Foreign Application Priority Data

Oct. 19, 2001 (JP) .................................. P2001-322433

(51) Int. Cl.$^7$ .............................................. H01S 3/19
(52) U.S. Cl. ............................. 372/36; 372/44; 372/50
(58) Field of Search ............................ 372/36, 44, 50

(56) References Cited

U.S. PATENT DOCUMENTS

| | | | | |
|---|---|---|---|---|
| 4,953,171 A | * | 8/1990 | Nakajima et al. | 372/44 |
| 5,140,384 A | * | 8/1992 | Tanaka | 257/36 |
| 5,296,724 A | * | 3/1994 | Ogata et al. | 257/98 |
| 5,485,479 A | * | 1/1996 | Kitamura et al. | 372/43 |
| 5,519,720 A | * | 5/1996 | Hirano et al. | 372/36 |
| 5,614,735 A | * | 3/1997 | Kitamura et al. | 257/99 |
| 5,638,391 A | * | 6/1997 | Shima et al. | 372/44 |
| 5,878,069 A | * | 3/1999 | Kamibayashi et al. | 372/36 |
| 6,347,107 B1 | * | 2/2002 | Roddy et al. | 372/49 |
| 6,410,904 B1 | * | 6/2002 | Ito et al. | |
| 2002/0075915 A1 | | 6/2002 | Yagi | |
| 2002/0075916 A1 | * | 6/2002 | Sato et al. | 372/36 |

FOREIGN PATENT DOCUMENTS

| | | |
|---|---|---|
| JP | 6005990 | 1/1994 |
| JP | 9139541 | 5/1997 |
| JP | 10256649 | 9/1998 |

* cited by examiner

*Primary Examiner*—Don Wong
*Assistant Examiner*—Dung (Michael) T Nguyen
(74) *Attorney, Agent, or Firm*—Nixon & Vanderhye P.C.

(57) ABSTRACT

A semiconductor laser device comprises a semiconductor laser chip, a first member which has one surface substantially perpendicular to a direction of an emission laser beam and has a concave having a bottom face substantially parallel to the one surface, and a second member inserted into the concave and joined to the first member. The semiconductor laser chip is disposed to the bottom face of the concave of the first member. The second member is inserted and joined into the concave of the first member so as to cover the semiconductor laser chip. Consequently, it is avoided to impair smoothness of the one surface of the first member, so that it is possible to precisely join the first and second members after being joined together to a desired apparatus at the one surface.

15 Claims, 9 Drawing Sheets

SEMICONDUCTOR LASER DEVICE

BACKGROUND OF THE INVENTION

1. Field of the Invention

The present invention relates to a semiconductor laser device which is provided in an optical pickup apparatus used to record or reproduce information on or from an optical recording media.

2. Description of the Related Art

A semiconductor laser device is installed in an optical pickup apparatus and used to record or reproduce information on or from an optical recording media.

Figure 11A:
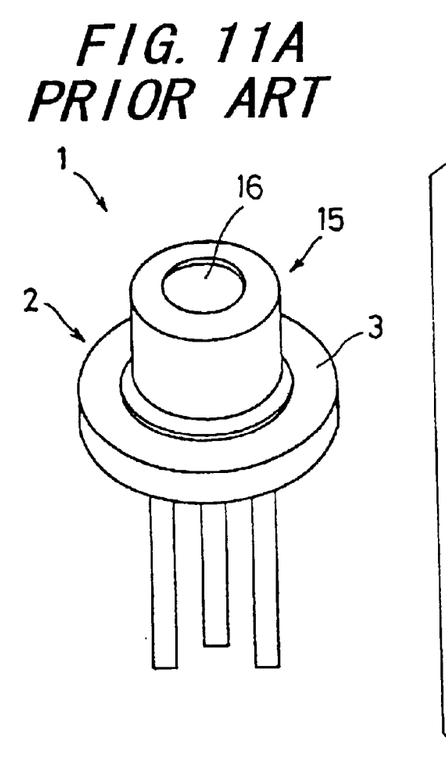
FIGS. 11A and 11B are simplified perspective views showing the construction of a semiconductor laser device of the prior art.
Figure 11B:
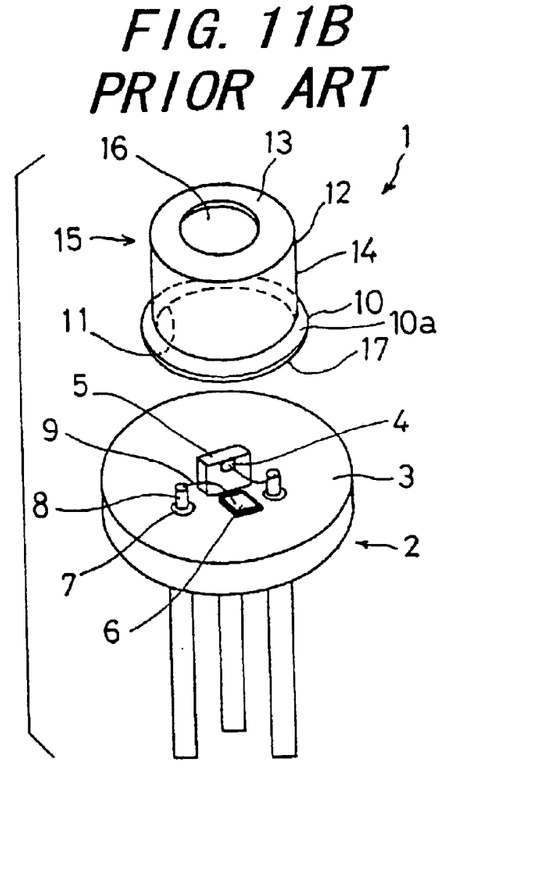

FIGS. 11A and 11B are simplified perspective views showing the construction of a semiconductor laser device 1 of the prior art. In the semiconductor laser device 1, a semiconductor laser chip 4 is mounted on one surface 3 of a first member 2 which is shaped into a circular disc and made of metal, and a heat sink 5 which efficiently diffuses heat generated when the semiconductor laser chip 4 emits a laser beam and a photodiode 6 which receives part of a light beam emitted from the semiconductor laser chip 4 and monitors laser output are firmly attached to each other by a die bond.

Optical output of the semiconductor laser chip 4 detected by the photodiode 6 is inputted to an APC (automatic power control), which is a system controller provided with a CPU (central processing unit) not shown in the drawings. The APC responds to optical detection output and controls a driving current of the semiconductor laser chip 4, thereby keeping output of the semiconductor laser chip 4 constant.

The semiconductor laser chip 4 and the photodiode 6 are electrically connected by wires 9 made of metal to lead pins 8. The lead pins 8 are fixed to the first member 2 and their surfaces are insulated by glass sealing parts 7. A hollow second member 15 made of metal is disposed so as to cover the semiconductor laser chip 4. The second member 15 is shaped like a cylinder having a bottom so as to have a peripheral wall 14 of a cylindrical shape and an end wall 13 which blocks a base end 12 of the peripheral wall 14. Accordingly, an opening 11 is formed on an open end 10 of the second member 15. To the end wall 13 of the second member, a laser beam emitting glass window 16 is disposed. At the open end 10 of the second member 15 is formed a flange 10a which protrudes radially outward from the circumference of the peripheral wall 14. The second member 15 is joined to the first member 2 by resistance welding in a state where an end face 17 of the flange 10a of the open end 10 abuts onto the one surface 3 of the first member 2.

At the time of attaching the semiconductor laser device 1 to an optical pickup apparatus, the one surface 3 of the first member 2 is made to adhere to an attachment face of the optical pickup apparatus, and fixed by a resin or the like after angular displacement of the semiconductor laser device 1 is made and a mounting position is adjusted so that a light beam emitted from the semiconductor laser chip 4 is focused in an appropriate position on an optical recording media. In an optical pickup apparatus provided with the semiconductor laser device 1, a light beam focused and reflected on an optical recording media is diffracted by a beam splitter or the like and focused on a signal reading photodiode, where signals are detected.

In cases where an optical pickup apparatus provided with a semiconductor laser device is installed in a portable optical disc player and the like, a semiconductor laser device is required to be small and lightweight for portable use. Another prior art for realizing miniaturization of a semiconductor laser device is disclosed in Japanese Unexamined Patent Publication JP-A 6-5990 (1994).

Figure 12A:
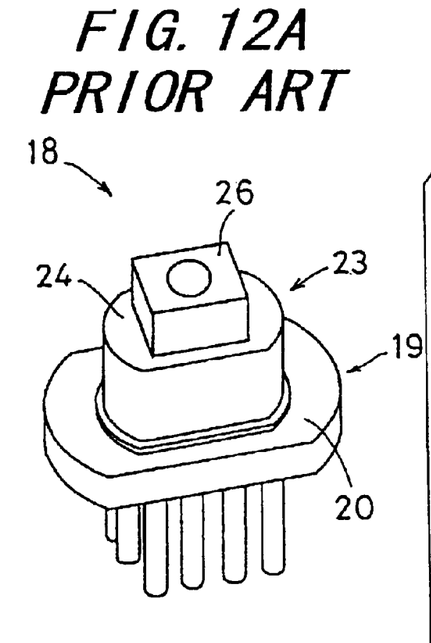
FIGS. 12A and 12B are simplified perspective views showing the construction of another semiconductor laser device of the prior art.
Figure 12B:
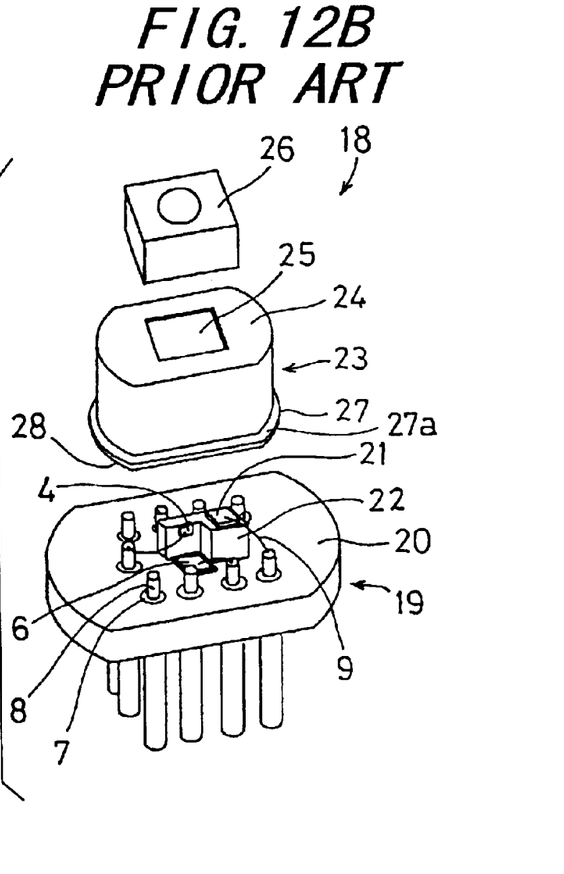

FIGS. 12A and 12B are simplified perspective views showing the construction of another semiconductor laser device 18 of the prior art. The semiconductor laser device 18 is characterized in that the projected shape onto the plane parallel to one surface 20 of a first member 19 is substantially elliptic. More specifically, in the first member 19, a part not used to mount the semiconductor laser chip 4 and so on is removed, whereby the device is miniaturized so as not to wastefully occupy a space when installed in an optical pickup apparatus or the like.

On one surface 20 of the first member 19 having a substantially elliptic shape, a heat sink 22 on which the semiconductor laser chip 4 and a signal reading photodiode 21 are mounted and the laser output monitoring photodiode 6 are firmly attached by a die bond.

A second member 23 is shaped like a cylinder having a bottom so as to have a peripheral wall of a substantially elliptic shape and an end wall 24 which blocks a base end of the peripheral wall. A laser beam emitting glass window 25 is disposed to an end wall 24 of the second member 23. A hologram device 26 is firmly attached on the laser beam emitting glass window 25 by an epoxy resin. The hologram device 26 is set and fixed so that, in order to obtain desired signals from reflection light from an optical recording media, diffracted reflection light is received in an appropriate position on the signal reading photodiode 21.

Also in this semiconductor laser device 18 of the other prior art, at an open end of the second member 23 is formed a flange 27a which protrudes radially outward from the circumference of the peripheral wall. The second member 23 is joined to the first member 19 by resistance welding in the state where an end face 28 of the flange 27a of the open end 27 abuts onto the one surface 20 of the first member 19.

Moreover, at the time of measuring characteristics such as threshold current values, oscillation modes and the like of the semiconductor laser devices 1, 18, the semiconductor laser devices 1, 18 are mounted on a mounting portion of a measurement apparatus at the one surfaces 3, 20 of the first members 2, 19, whereby each measurement is done.

The semiconductor device 1 of the aforementioned prior art and the semiconductor laser device 18 of the other prior art have the following problems.

As described before, the first members 2, 19 provided in the respective semiconductor laser devices 1, 18 are joined to the second members 15, 23 by resistance welding at the one surfaces 3, 20. In resistance welding, spatters, which are droplets of molten metal, are generated frequently, and when spatters are generated, the spatters fuse with the one surface, or even when not fuse, because of collisions of the spatters, rough and large irregularities are formed at collision spots on the one surface. There is such a problem that after the second member and the first member are joined together, when the first member is attached to an attachment portion of, for example, an optical pickup apparatus or a measurement apparatus at the one surface of the first member, the spatters fusing on the one surface of the first member and the rough and large irregularities formed thereon worsen attachment precision to the apparatus.

Moreover, although it can be thought to mount to an apparatus by making the first member larger and using a rim portion of the first member, which is rarely influenced by spatters due to resistance welding, as one means for solving the problem on the one surface caused by resistance welding, there is such a problem that in cases where the device is used in an optical pickup apparatus installed in a portable optical disc player and the like as described before, the device becomes larger by making the first member larger, and handiness and portability of a portable optical disc player are impaired.

SUMMARY OF THE INVENTION

An object of the present invention is to provide semiconductor laser device which can be attached to a desired apparatus with precision by preventing roughness of a surface of a joint member due to welding.

The invention provides a semiconductor laser device, comprising:

a semiconductor laser chip for emitting a laser beam;

a first member on which the semiconductor laser chip is mounted, the first member having one surface substantially perpendicular to an emission direction of a laser beam from the semiconductor laser chip in the state of being mounted, and a concave having a bottom face substantially parallel to the one surface, and the semiconductor laser chip being disposed to the bottom face of the concave; and a second member shaped like a cylinder having a bottom, an open end of the second member being inserted into the concave to mount the second member on the first member so as to cover the semiconductor laser chip.

According to the invention, the first member has one surface substantially perpendicular to an emission direction of a laser beam from the semiconductor laser chip, and has a concave having a bottom face substantially parallel to the one surface, and the semiconductor laser chip is disposed to the bottom face of the concave. Into the concave of the first member, the open end of the second member which is shaped like a cylinder having a bottom is inserted, and the second member is joined to, that is, mounted on the first member at the concave so as to cover the semiconductor laser chip. Consequently, it is avoided that when the first member and the second member are joined together by, for example, resistance welding, fusion of spatters generated at the time of resistance welding and wastage due to collisions of the spatters (such a state that smoothness of the one surface is impaired will be referred to as roughness hereafter) are caused on the one surface of the first member, with the result that it is possible to attach the first and second members after being joined together to a desired apparatus with precision.

Further, in the invention it is preferable that on the open end of the second member a protrusion which protrudes toward an insertion direction is formed; and the second member is joined to the bottom face of the concave via the protrusion.

According to the invention, the second member is joined to the first member at the bottom face of the concave via the protrusion, which is formed on the open end and protrudes toward an insertion direction into the concave of the first member, so that it is avoided to cause roughness on the one surface of the first member, and the second member is securely fused and joined to the first member by the protrusion. As a result, it is possible to attach the first and second members after being joined together to a desired apparatus at the one surface with precision.

Still further, in the invention it is preferable that around the open end of the second member, a protrusion which protrudes outward from the second member, and the second member is joined to a wall face of the concave via the protrusion.

According to the invention, the second member is joined to the first member at the wall face of the concave via the protrusion formed around the open end and protruding outward, so that it is avoided to cause roughness on the one surface of the first member, and the second member is securely fused and joined to the first member by the protruding. As a result, it is possible to attach the first and second members after being joined together to a desired apparatus at the one surface with precision.

Still further, in the invention it is preferable that on the second member, a notch portion which extends in a direction parallel to a direction of inserting the second member into the concave is formed.

According to the invention, on the second member, the notch portion extending in a direction parallel to a direction of inserting the second member into the concave is formed, so that it becomes possible to insert such a second member that has a larger size than an opening size of the concave, and it is possible to join the wall face of the concave and the second member to each other with no space.

Still further, the invention provides an optical pickup apparatus comprising:

a semiconductor laser device including:

a semiconductor laser chip for emitting a laser beam; a first member on which the semiconductor laser chip is mounted; a first member having one surface substantially perpendicular to an emission direction of a laser beam from the semiconductor laser chip in the state of being mounted, and a concave having a bottom face substantially parallel to the one surface, on a bottom face of which concave the semiconductor laser chip is disposed; and a second member which is shaped like a cylinder having a bottom, an open end of the second member being inserted into the concave to mount the second member on the first member so as to cover the semiconductor laser chip;

focusing means for focusing the light beam emitted from the semiconductor laser device to an optical reflector and for conducting light reflected from the optical reflector to the semiconductor laser device; and optical detecting means for detecting the light reflected by the optical reflector and conducted by the focusing means.

According to the invention, it is possible to precisely attach the semiconductor laser device to the optical pickup apparatus at the one surface of the first member without applying a care process for smoothing the one surface of the first member after joining the first member and the second member to each other. As a result, it is possible to realize reduction of manufacturing man-hour of the optical pickup apparatus, and it becomes possible to accurately focus an emission light beam from the semiconductor laser device by the focusing means in a focusing position of an optical recording media, which is an optical reflector, and precisely detect signals of reflection light from the optical recording media by the optical detecting means.

According to the invention, the open end of the second member is inserted into the concave formed on the one surface of the first member, and the second member is joined to the first member at the concave so as to cover the semiconductor laser chip and so on, with the result that it is avoided to cause roughness on the one surface of the first member. Consequently, it is possible to attach the first and second members after being joined together to a desired apparatus at the one surface with precision.

Further, according to the invention, it is possible to precisely place the semiconductor laser device to the optical pickup apparatus at the one surface of the first member without applying a process for smoothing the one surface of the first member. As a result, it is possible to realize reduction of manufacturing man-hour of the optical pickup apparatus, and it becomes possible to accurately focus an emission light beam from the semiconductor laser device by the focusing means in a focusing position of an optical recording media, and precisely detect signals of reflection light from the optical recording media by the optical detecting means.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

Figure 1:
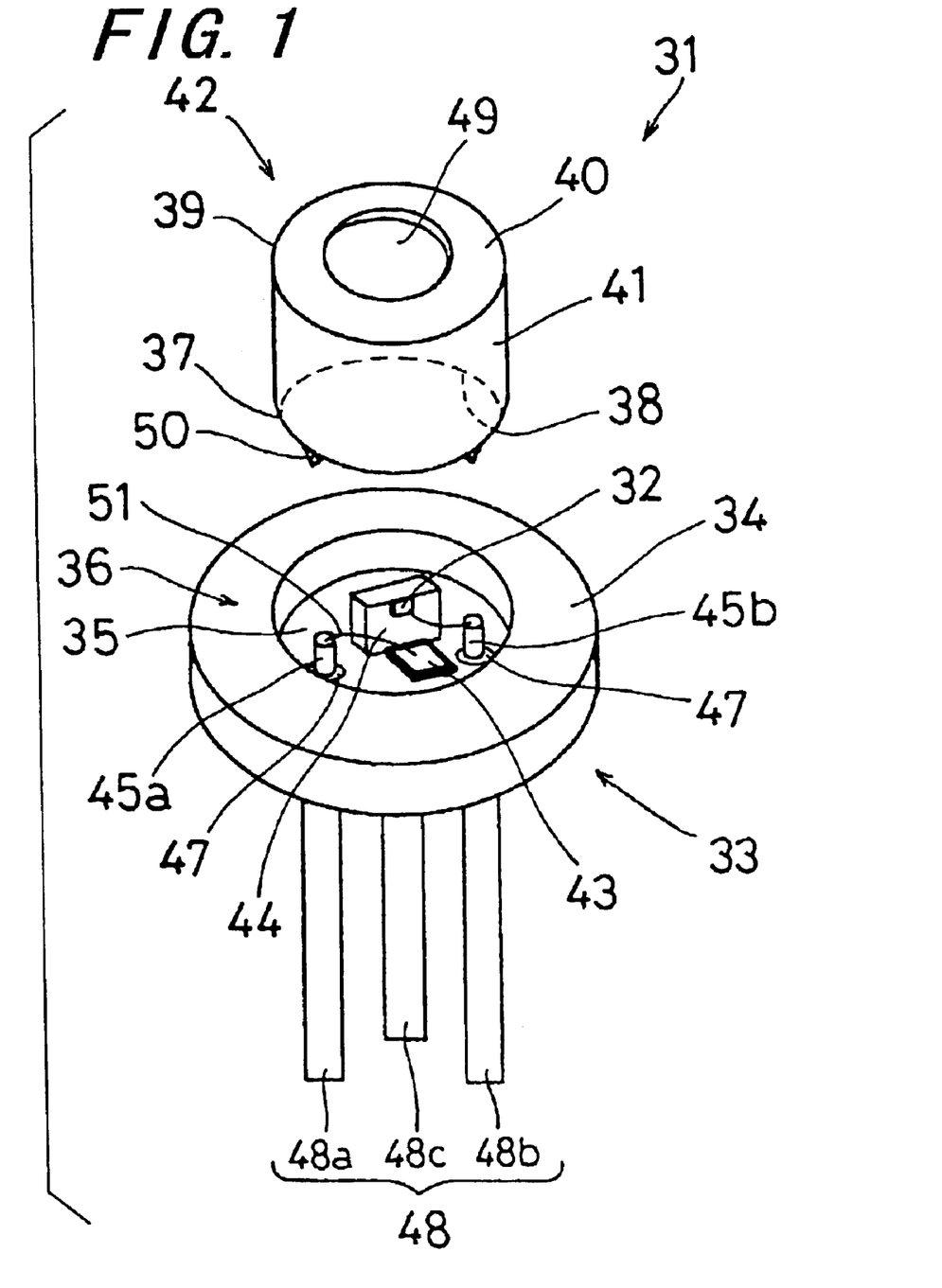
FIG. 1 is a simplified exploded perspective view showing the construction of a semiconductor laser device, which is a first embodiment of the present invention.
Figure 2:
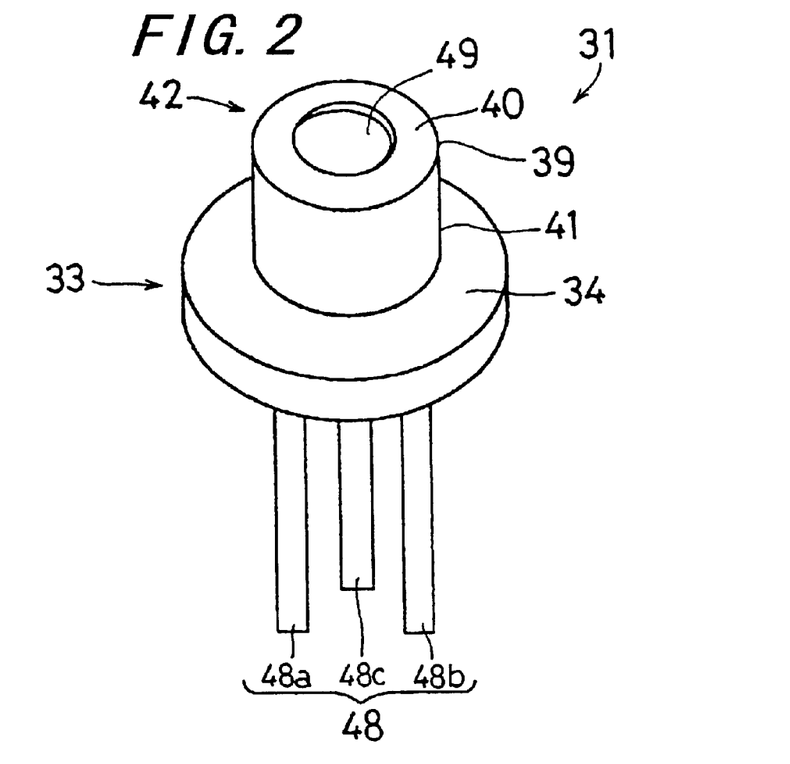
FIG. 2 is a perspective view showing the state where the semiconductor laser device is composed.
Figure 3:
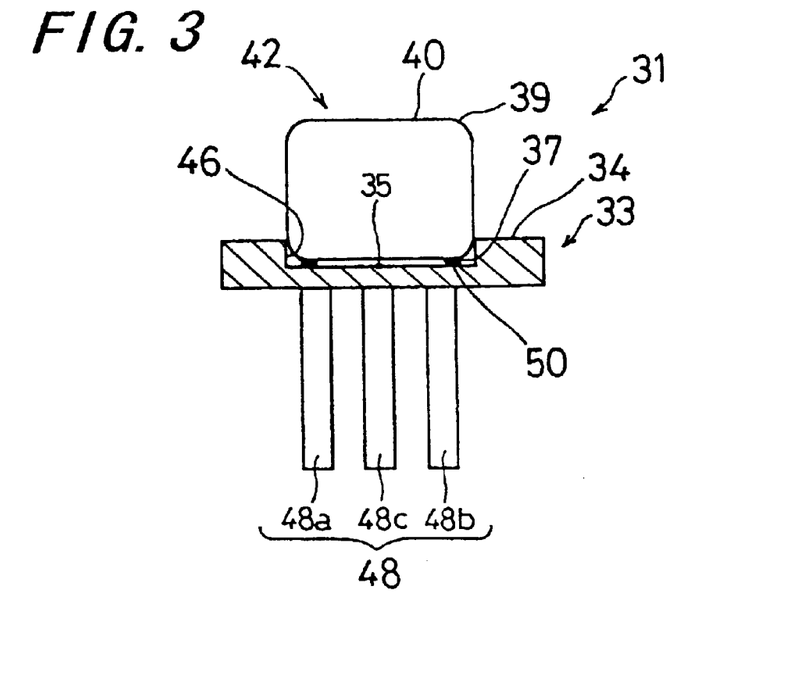
FIG. 3 is a partial section view of the semiconductor laser device.

FIG. 1 is a simplified exploded perspective view showing the construction of a semiconductor laser device 31, which is a first embodiment of the present invention, FIG. 2 is a perspective view showing the state where the semiconductor laser device 31 shown in FIG. 1 is composed, and FIG. 3 is a partial section view of the semiconductor laser device 31 shown in FIG. 1.

The semiconductor laser device 31 includes a semiconductor laser chip 32, a first member 33, and a second member 42. The semiconductor laser chip 32 emits a laser beam. On the first member 33 is mounted the semiconductor laser chip 32. The first member 33 has one surface 34 substantially perpendicular to an emission direction of the laser beam from the semiconductor laser chip 32 in the state of being mounted and a concave 36 having a bottom face 35 substantially parallel to the one surface 34. In the first member 33, the semiconductor laser chip 32 is disposed on the bottom face 35 of the concave 36. The second member 42 is shaped like a cylinder having a bottom. That is, the second member 42 has a peripheral wall 41 of a cylindrical shape and an end wall 40 which blocks a base end 39 of the peripheral wall 41. Accordingly, the second member 42 is formed to be hollow and at an open end 37 thereof is formed an opening 38. The peripheral wall 41 is disposed so as to rise from the end wall 40. The open end 37 of the second member 42 is inserted into the concave 36, joined to and mounted on the first member 33 so as to cover the semiconductor laser chip 32.

The semiconductor laser chip 32 is a light source which emits a laser beam of, for example, 780 nm. The first member 33 is a member made of metal such as steel shaped into a circular disc or a cylinder whose length in the axial direction is shorter, and on the concave 36 formed on the one surface 34, a photodiode 43, a heat sink 44 and lead pins 45 are mounted. Moreover, a wall face 46 of the concave 36 is covered with an insulation material.

The photodiode 43 receives part of a light beam emitted from the semiconductor laser chip 32, and monitors laser output. Optical output detected by the photodiode 43 is inputted to an APC (automatic power control), which is a system controller provided with a CPU not shown in the drawings. The APC responds to optical detection output and controls a driving current of the semiconductor laser chip 32, thereby keeping output of the semiconductor laser chip 32 constant.

The heat sink 44 is a thermal diffusion member made of metal such as copper with high thermal conductivity. Since the semiconductor laser chip 32 is mounted on the heat sink 44, heat generated at the time of emitting a laser beam is diffused by the heat sink 44 with efficiency. The lead pins 45 are conductive members made of, for example, copper, insulated by glass sealing parts 47, and fixed to the first member 33. The lead pins 45a, 45b are electrically connected to first and second lead frames 48a, 48b, respectively, and the semiconductor laser chip 32 and the photodiode 43 are electrically connected to a third lead frame 48c.

The second member 42 is a member made of metal such as copper which has a substantially cylindrical outer shape. On the end wall 40, a laser beam emitting glass window 49 through which an emitted laser beam passes is disposed. Moreover, on the open end 37 of the second member 42, a protrusion 50 which protrudes toward an insertion direction into the concave 36 is formed.

The semiconductor laser chip 32 is firmly attached to the heat sink 44 by a die bond. The heat sink 44 and the photodiode 43 are firmly attached to the bottom face 35 of the concave 36 by a die bond. The semiconductor laser chip 32 and the photodiode 43 are electrically connected to the lead pins 45 by wires 51 made of metal. So that the second member 42 covers the semiconductor laser chip 32, the photodiode 43 and so on, the open end 37 of the second member 42 is inserted into the concave 36 of the first member 33, and joined to the first member 33 at the bottom face 35 of the concave 36 via the protrusion 50 by resistance welding. Since the one surface 34 of the first member 33 is substantially parallel to the bottom face 35 of the concave 36, the second member 42 joined at the bottom face 35 of the concave 36 extends in a direction substantially perpendicular to the one surface 34, and the semiconductor laser chip 32 firmly attached to the bottom face 35 of the concave 36 via the heat sink 44 emits a laser beam in a direction substantially perpendicular to the one surface 34.

By inserting the open end 37 of the second member 42 into the concave 36 of the first member 33 and joining via the protrusion 50 of the second member 42, it is avoided to cause roughness on the one surface 34 of the first member 33, and the second member 42 is securely fused and joined by the protrusion 50, with the result that it is possible to attach the first and second members 33, 42 after being joined together to a desired apparatus at the one surface 34 with precision.

Figure 4:
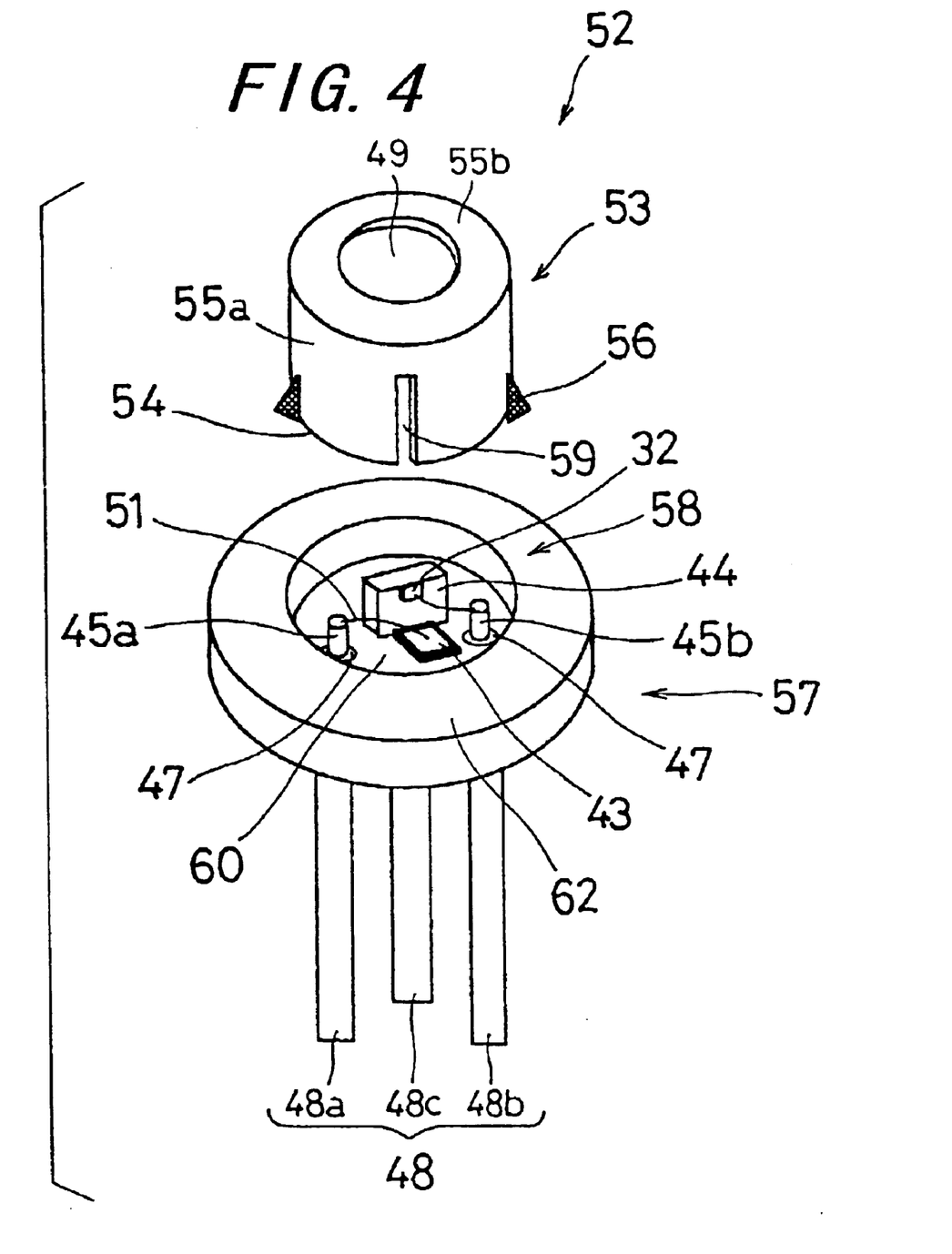
FIG. 4 is a simplified exploded perspective view showing the construction of a semiconductor laser device, which is a second embodiment of the invention.
Figure 5:
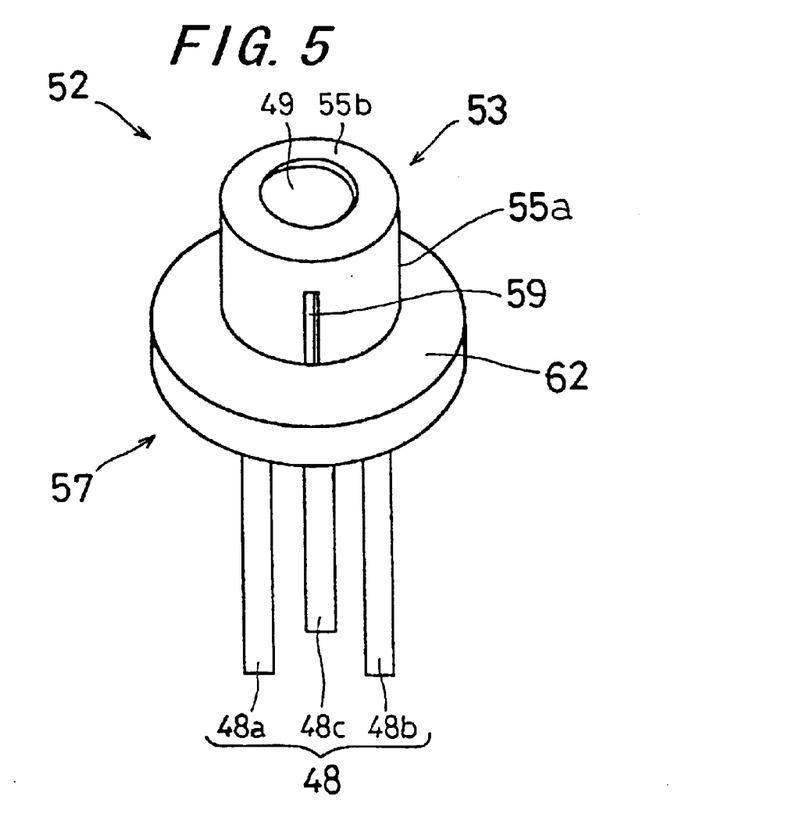
FIG. 5 is a perspective view showing the state where the semiconductor laser device is composed.
Figure 6:
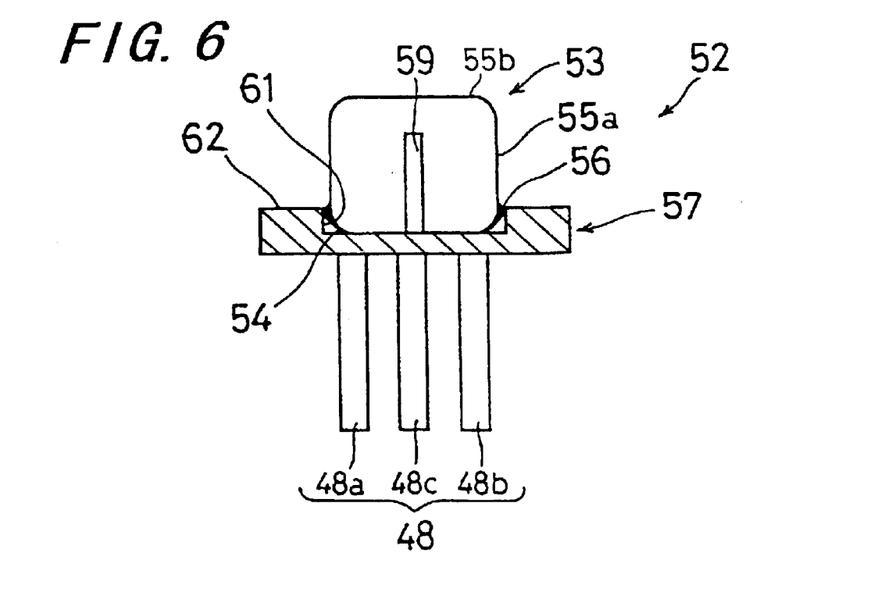
FIG. 6 is a partial section view of the semiconductor laser device.

FIG. 4 is a simplified exploded perspective view showing the construction of a semiconductor laser device 52, which is a second embodiment of the invention, FIG. 5 is a perspective view showing the state where the semiconductor laser device 52 shown in FIG. 4 is composed, and FIG. 6 is a partial section view of the semiconductor laser device 52 shown in FIG. 4.

The semiconductor laser device 52 is similar to the semiconductor laser device 31 of the first embodiment, and corresponding parts will be denoted by the same reference numerals to omit explanations thereof. It should be noted that a second member 53 is shaped like a cylinder having a bottom so as to have a peripheral wall 55a of a cylindrical shape and an end wall 55b which blocks a base end of the peripheral wall 55a, wherein around an open end 54, protrusions 56 which protrude outward from the peripheral wall 55a are provided, and on the peripheral wall 55a, a notch portion 59 which extends in a direction parallel to a direction of inserting into a concave 58 formed on a first member 57 is provided. Moreover, a bottom face 60 of the concave 58 is covered with an insulation material, and a wall face 61 of the concave 58 has conductivity as it remains a steel surface.

The semiconductor laser chip 32 and the photodiode 43 are electrically connected to the lead pins 45 by the wires 51. The open end 54 of the second member 53 is inserted into the concave 58 of the first member 57 so that the second member 53 covers the semiconductor laser chip 32, the photodiode 43 and so on. Since the second member 53 has the notch portion 59 formed on the peripheral wall 55, the peripheral wall 55 can be transformed easily, so that it becomes possible to insert such a second member 53 that has a larger size than an opening size of the concave 58 of the first member 57 into the concave 58. Since the bottom face 60 of the first member 57 is covered with an insulation material, the inserted second member 53 is joined by resistance welding to the first member 57 via the protrusion 56 at the conductive wall face 61 of the concave 58. Since one surface 62 of the first member 57 is substantially parallel to the bottom face 60 of the concave 58, the second member 53 joined at the wall face 61 while abutting onto the bottom face 60 of the concave 58 extends in a direction substantially perpendicular to the one surface 62, and the semiconductor laser chip 32 firmly attached to the bottom face 60 of the concave 58 via the heat sink 44 emits a laser beam in a direction substantially perpendicular to the one surface 62.

Although the second member 53 is constructed so as to have an external diameter size larger than the opening size of the concave 58 of the first member 57 in the embodiment, the second member may be constructed so as to have the same external diameter size as the opening size of the concave 58 and be provided with only the protrusion on the peripheral wall.

By inserting the open end 54 of the second member 53, which is larger than the opening size of the concave 58 and has the notch portion 59 formed on the peripheral wall 55 into the concave 58, and joining via the protrusion 56 formed on the peripheral wall 55 of the second member 53, it becomes possible to securely fuse and join the second member 53 to the wall face 61 of the concave 58 with no space, and it is avoided to cause roughness on the one surface 62 of the first member 57, with the result that it is possible to attach the first and second members 57, 53 after being joined together to a desired apparatus at the one surface 62 with precision.

Figure 7:
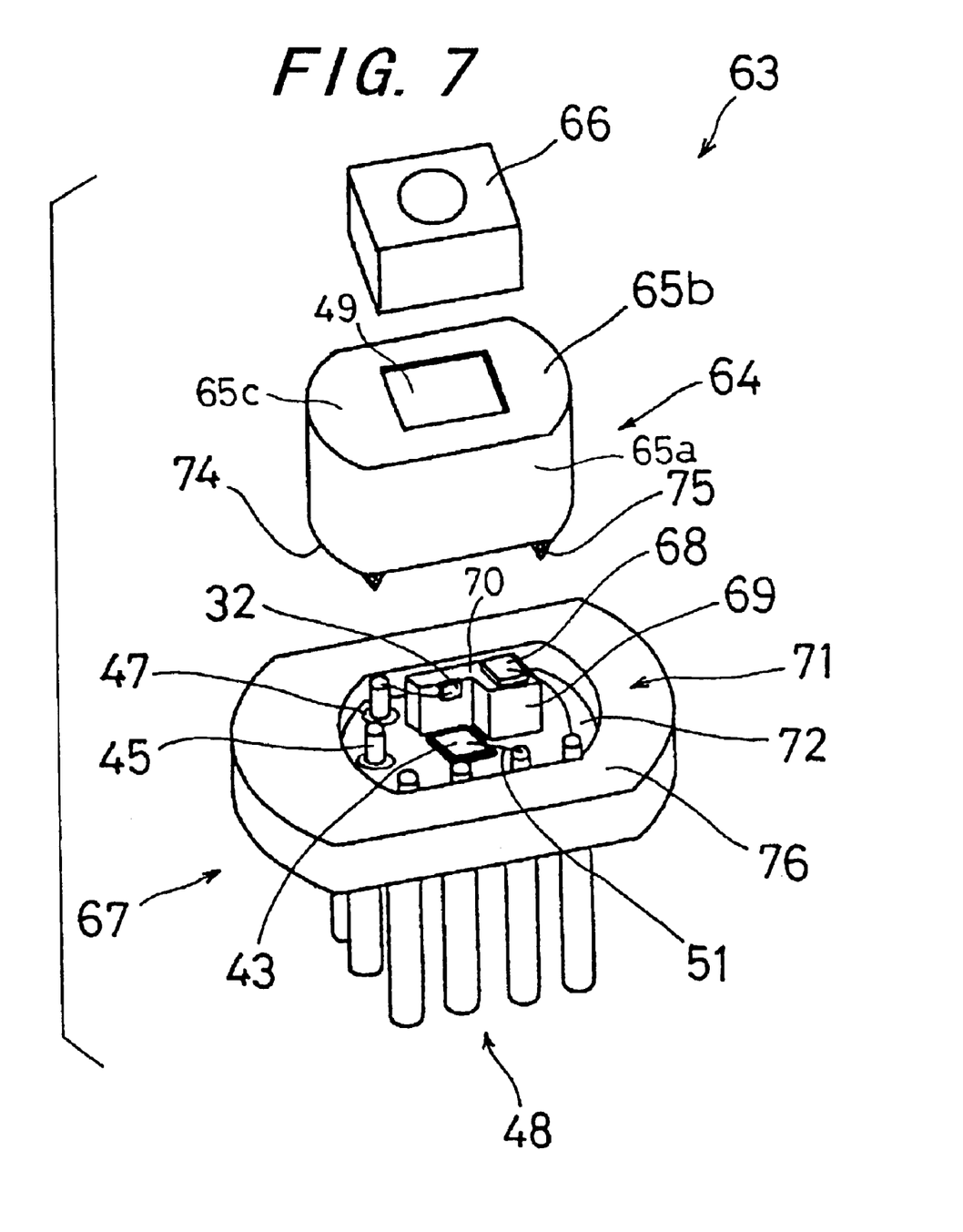
FIG. 7 is a simplified exploded perspective view showing the construction of a semiconductor laser device, which is a third embodiment of the invention.
Figure 8:
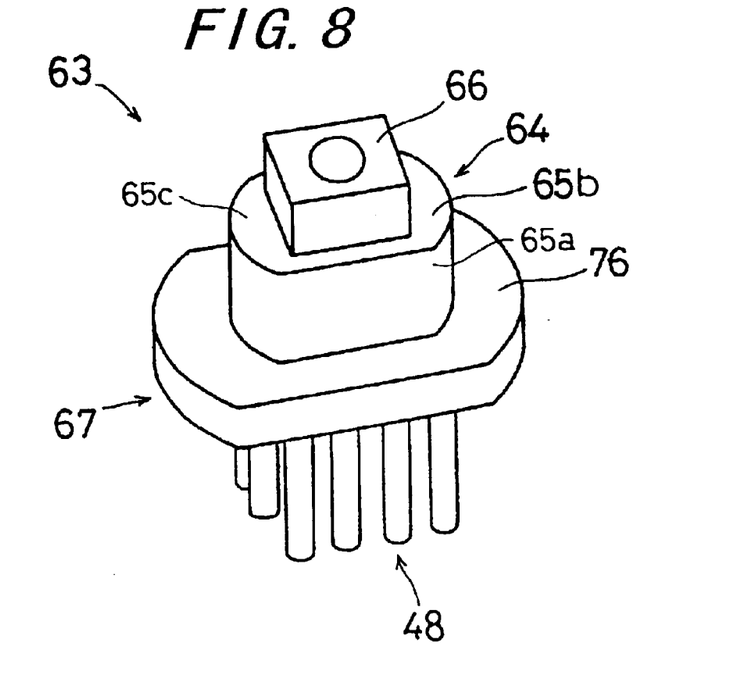
FIG. 8 is a perspective view showing the state where the semiconductor laser device is composed.
Figure 9:
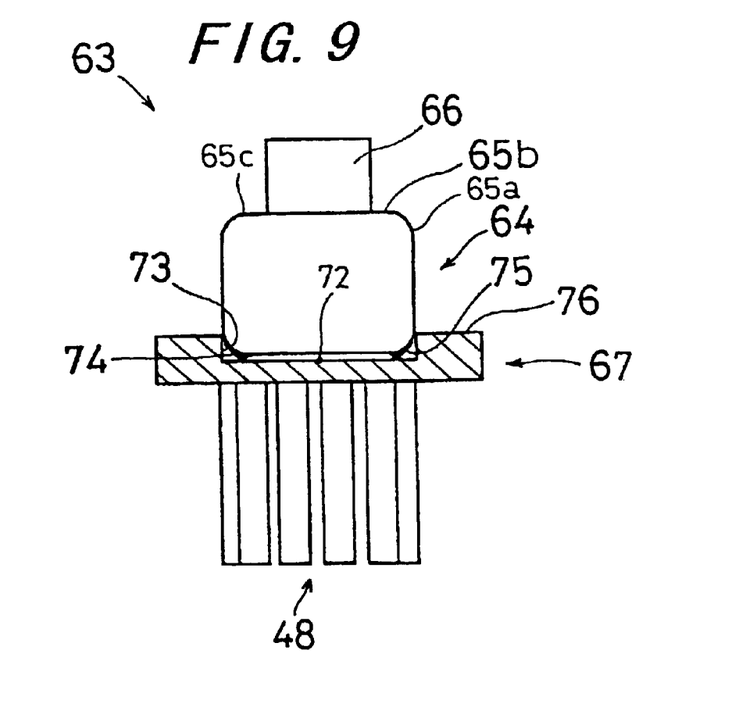
FIG. 9 is a partial section view of the semiconductor laser device.

FIG. 7 is a simplified exploded perspective view showing the construction of a semiconductor laser device 63, which is a third embodiment of the invention, FIG. 8 is a perspective view showing the state where the semiconductor laser device 63 shown in FIG. 7 is composed, and FIG. 9 is a partial section view of the semiconductor laser device 63 shown in FIG. 7.

The semiconductor laser device 63 of the embodiment is similar to the semiconductor laser device 31 of the first embodiment, and corresponding parts will be denoted by the same reference numerals to omit explanations thereof. It should be noted that a second member 64 is shaped like a cylinder having a bottom so as to have a peripheral wall 65a of a substantially elliptic shape and an end wall 65b which blocks a base end of the peripheral wall 65a, and a hologram device 66 is disposed to the end wall 65b. Moreover, a first member 67 is provided with a signal reading photodiode 68.

The hologram device 66 is an optical member which is formed by a glass substrate and provided with a hologram on an upper face thereof and a tracking beam generating diffraction grating on a lower face thereof. A light beam emitted from the semiconductor laser chip 32 and passing through the hologram device 66 is diffracted by the diffraction grating provided in the hologram device 66, and divided into three diffraction light beams, and light which enters into the hologram device 66 is further diffracted by the hologram, and received by the signal reading photodiode 68 disposed to the first member 67, where detection signals such as tracking error signals are detected. The signal reading photodiode 68 is firmly attached to an upper face 70 of a heat sink 69 by a die bond.

The semiconductor laser chip 32 is firmly attached to the heat sink 69 by a die bond, and the heat sink 69 and the photodiode 43 are firmly attached to a bottom face 72 of a concave 71 by a die bond. The firmly attached semiconductor laser chip 32, signal reading photodiode 68 and photodiode 43 are electrically connected to the lead pins 45 by the wires 51. A number of lead frames 48 are disposed for electrical connection as disposed members such as the signal reading photodiode 68 are increased.

In the same manner as in the first embodiment, a wall face 73 of the first member 67 is covered with an insulation material, and an open end 74 of the second member 64 is inserted into the concave 71 of the first member 67 so that the second member 64 covers the semiconductor laser chip 32 and so on, and joined by resistance welding to the first member 67 at the bottom face 72 of the concave 71 via a protrusion 75 formed on the open end 74 of the second member 64. Since one surface 76 of the first member 67 is substantially parallel to the bottom face 72 of the concave 71, the one surface 65c of the end wall 65b of the second member 64 joined at the bottom face 72 of the concave 71 and the one surface 76 of the first member 67 keep a parallel relation, and precision of attaching the hologram device 66 is kept.

The second member may be constructed so as to be at least larger in external diameter size of the open end than the opening size of the concave, provided with the protrusion and the notch portion on the peripheral wall around the open end, and joined to the first member at the wall face of the concave.

As described above, the semiconductor laser device 63 of the embodiment is provided with the hologram device 66, so that it becomes possible in a single device to diffract an emission light beam and reflection light and detect detection signals such as tracking error signals.

Figure 10:
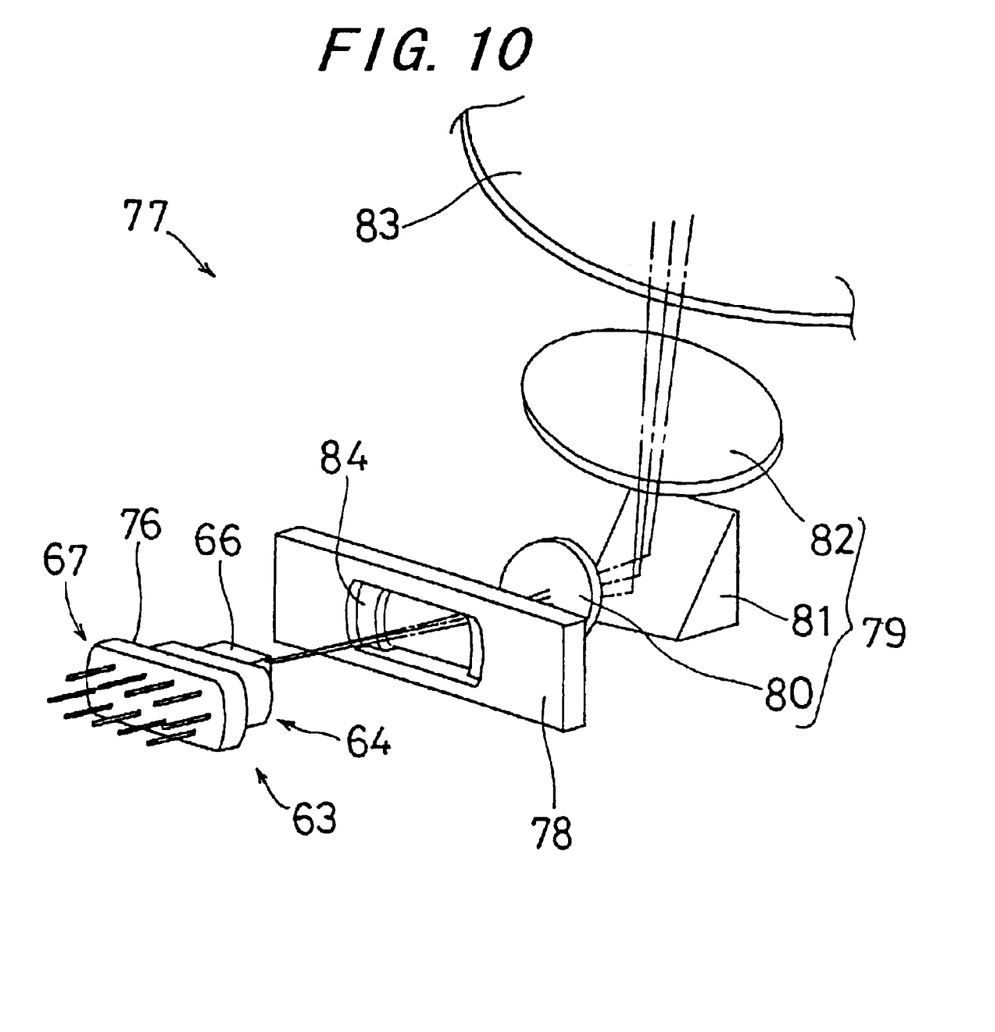
FIG. 10 is a simplified system view showing the construction of an optical pickup apparatus provided with the semiconductor laser device.

FIG. 10 is a simplified system view showing the construction of an optical pickup apparatus 77 provided with the semiconductor laser device 63 shown in FIG. 7. The optical pickup apparatus 77 comprises the semiconductor laser device 63, a semiconductor laser device attaching board 78, and focusing means 79.

The focusing means 79 includes a collimating lens 80, a rise mirror 81, and an objective lens 82. The collimating lens 80 makes an emission light beam from the semiconductor laser chip 32 parallel light. The rise mirror 81 reflects incident light having passed through the collimating lens 80 toward an optical recording media 83, and reflects incident light having been reflected by the optical recording media 83 toward the collimating lens 80. The objective lens 82 focuses an emission light beam onto the optical recording media 83.

At the time of mounting the semiconductor laser device 63 to the optical pickup apparatus 77, a position of mounting the semiconductor laser device 63 is adjusted so that three emission light beams diffracted by the hologram 66 are focused appropriately in a focusing position on the optical recording media 83, and an attachment face 84 of the semiconductor laser device attaching board 78 is fixed to the one surface 76 of the first member 67 by a resin or the like.

A light beam emitted from the semiconductor laser chip 32 is diffracted to three diffraction light beams by the hologram device 66. The three diffraction light beams are made to be parallel light by the collimating lens 80, reflected toward the optical recording media 83 by the rise mirror 81, and focused on the optical recording media 83 by the objective lens 82. After passing through the objective lens 82, being reflected by the rise mirror 81 and passing through the collimating lens 80, light reflected from the optical recording media 83 is further diffracted by the hologram device 66 and received on the signal reading photodiode 68 within the semiconductor laser device 63, which is optical detecting means.

In this manner, it is possible to precisely attach the semiconductor laser device 63 to the optical pickup apparatus 77 at the one surface 76 of the first member 67 without applying a care process for smoothing the one surface 76 of the first member 67, so that it becomes possible to realize reduction of manufacturing man-hour of the pickup apparatus 77. Moreover, it is possible to accurately focus an emission light beam from the semiconductor laser device 63 in a focusing position on the optical recording media 83 by the focusing means 79, and precisely detect signals of reflection light from the optical recording media 83 by the optical detecting means.

Although the optical pickup apparatus 77 has a construction of comprising the semiconductor laser device 63 provided with the signal reading photodiode 68 according to the fourth embodiment of the invention as described above, the apparatus may not be restricted in this construction, and may have a construction of comprising the semiconductor laser device 31 or 52 of the first or second embodiment and the signal reading photodiode, respectively.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor laser device, comprising:

a semiconductor laser chip for emitting a laser beam;

a first member on which the semiconductor laser chip is mounted, the first member having one surface substantially perpendicular to an emission direction of a laser beam from the semiconductor laser chip in the state of being mounted, and a concave having a bottom face substantially parallel to the one surface, and the semiconductor laser chip being mounted on the bottom face of the concave; and a second member shaped like a cylinder having a bottom, an open end of the second member being slidably inserted into the concave to mount the second member on the first member so as to cover the semiconductor laser chip.

2. The semiconductor laser device of claim 1, wherein on the open end of the second member a protrusion protrudes toward an insertion direction is formed; and the second member is joined to the bottom face of the concave via the protrusion.

3. The semiconductor laser device of claim 1, wherein around the open end of the second member, a protrusion which protrudes outward from the second member, and the second member is joined to a wall face of the concave via the protrusion.

4. The semiconductor laser device of claim 3, wherein on the second member, a notch portion which extends in a direction parallel to a direction of inserting the second member into the concave is formed.

5. The semiconductor laser device of claim 1, wherein the laser chip is mounted on the bottom face of the concave via a heat sink.

6. The semiconductor laser device of claim 1, wherein at least part of the laser chip is located within the concave at an elevation below an elevation of the one surface of the first member that is oriented substantially perpendicular to an emission direction of a laser beam from the semiconductor laser chip.

7. The semiconductor laser device of claim 1, wherein the first member is welded to the second member via a plurality of protrusions.

8. The semiconductor laser device of claim 1, wherein the first member is joined to the second member via a plurality of protrusions.

9. A semiconductor laser device, comprising:

a semiconductor laser chip for emitting a laser beam;

a first member on which the semiconductor laser chip is mounted, the first member having one surface substantially perpendicular to an emission direction of a laser beam from the semiconductor laser chip in the state of being mounted, and a concave having a bottom face substantially parallel to the one surface, and the semiconductor laser chip being mounted on the bottom face of the concave; and a second member shaped like a cylinder having a bottom, an open end of the second member being slidably inserted into the concave to mount the second member on the first member via at least one protrusion of the second member so as to cover the semiconductor laser chip, wherein the protrusion of the second member extends from a bottom portion thereof in order to contact the bottom face and/or a sidewall of the concave of the first member.

10. The semiconductor laser device of claim 9, wherein on the open end of the second member the protrusion protrudes toward an insertion direction; and the second member is joined to the bottom face of the concave via the protrusion.

11. The semiconductor laser device of claim 9, wherein around the open end of the second member, the protrusion is formed and protrudes outward from the second member, and the second member is joined to a wall face of the concave via the protrusion.

12. The semiconductor laser device of claim 11, wherein on the second member, a notch portion which extends in a direction parallel to a direction of inserting the second member into the concave is formed.

13. The semiconductor laser device of claim 9, wherein at least part of the laser chip is located within the concave at an elevation below an elevation of the one surface of the first member that is oriented substantially perpendicular to an emission direction of a laser beam from the semiconductor laser chip.

14. The semiconductor laser device of claim 9, wherein the first member is welded to the second member via a plurality of the protrusions.

15. A semiconductor laser device, comprising:

a semiconductor laser chip for emitting a laser beam;

a first member on which the semiconductor laser chip is mounted, the first member having one surface substantially perpendicular to an emission direction of a laser beam from the semiconductor laser chip in the state of being mounted, and a concave having a bottom face substantially parallel to the one surface, and the semiconductor laser chip being mounted on the bottom face of the concave; and a second member shaped like a cylinder having a bottom, an open end of the second member being slidably inserted into the concave to mount the second member on the first member so as to cover the semiconductor laser chip, the second member having a window through which a laser beam passes.

* * * * *